United States Patent
Ohashi et al.

(10) Patent No.: US 11,430,106 B2
(45) Date of Patent: Aug. 30, 2022

(54) IMAGE PROCESSING DEVICE, IMAGE PROCESSING METHOD AND CHARGED PARTICLE MICROSCOPE

(71) Applicant: HITACHI HIGH-TECH CORPORATION, Tokyo (JP)

(72) Inventors: Takeyoshi Ohashi, Tokyo (JP); Atsuko Shintani, Tokyo (JP); Masami Ikota, Tokyo (JP); Kazuhisa Hasumi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 286 days.

(21) Appl. No.: 16/638,033

(22) PCT Filed: Aug. 23, 2017

(86) PCT No.: PCT/JP2017/030057
§ 371 (c)(1),
(2) Date: Feb. 10, 2020

(87) PCT Pub. No.: WO2019/038841
PCT Pub. Date: Feb. 28, 2019

(65) Prior Publication Data
US 2020/0219243 A1   Jul. 9, 2020

(51) Int. Cl.
*G06T 7/00* (2017.01)
*G01B 15/04* (2006.01)
(Continued)

(52) U.S. Cl.
CPC .............. *G06T 7/001* (2013.01); *G01B 15/04* (2013.01); *G01N 23/22* (2013.01); *G06T 7/60* (2013.01);
(Continued)

(58) Field of Classification Search
CPC . G06T 7/001; G06T 7/60; G06T 2207/10056; G06T 2207/30148;
(Continued)

(56) References Cited

U.S. PATENT DOCUMENTS 5,138,179 A * 8/1992 Baba ................. C30B 15/26
117/15
5,961,716 A * 10/1999 White ................. C30B 15/26
117/14
(Continued)

FOREIGN PATENT DOCUMENTS

JP   H06170106 A   6/1994
JP   2005061837 A   3/2005
JP   2011119471 A   6/2011

OTHER PUBLICATIONS

"Scanning Electron Microscope"; Wikipedia; Old Revision Dated Aug. 20, 2017 (Year: 2017).*
(Continued)

*Primary Examiner* — Aaron W Carter
(74) *Attorney, Agent, or Firm* — Miles & Stockbridge P.C.

(57) ABSTRACT

An object of the invention is to quantitatively evaluate crystal growth amount in a wide range from an undergrowth state to an overgrowth state with nondestructive inspection. By using a plenty of image feature values such as pattern brightness, a pattern area and a pattern shape which are extracted from an SEM image, and depending on whether brightness inside a pattern is lower than brightness outside the pattern (401), undergrowth and overgrowth is determined (402, 405). Based on a brightness difference or the pattern area, a growth amount index or a normality index of crystal growth in a concave pattern such as a hole pattern or a trench pattern is calculated (404, 407).

4 Claims, 8 Drawing Sheets

(51) Int. Cl.
*G01N 23/22* (2018.01)
*G06T 7/60* (2017.01)
(52) U.S. Cl.
CPC ... *G01N 2223/07* (2013.01); *G01N 2223/102* (2013.01); *G01N 2223/401* (2013.01); *G01N 2223/418* (2013.01); *G01N 2223/602* (2013.01); *G06T 2207/10056* (2013.01); *G06T 2207/30148* (2013.01)

(58) Field of Classification Search
CPC ........ G06T 7/0004; G06T 2207/30108; G01B 15/04; G01B 2210/56; G01N 23/22; G01N 2223/07; G01N 2223/102; G01N 2223/401; G01N 2223/418; G01N 2223/602; G01N 23/2251; H01J 37/22; H01J 37/222
See application file for complete search history.

(56) References Cited

U.S. PATENT DOCUMENTS

| | | | | |
|---|---|---|---|---|
| 6,159,282 | A * | 12/2000 | Fujiwara | C30B 15/32 117/13 |
| 6,583,810 | B1 * | 6/2003 | Yamamura | C30B 15/26 117/14 |
| 2001/0001944 | A1 * | 5/2001 | Kitamura | C30B 29/30 117/13 |
| 2001/0033683 | A1 * | 10/2001 | Tanaka | G06T 7/001 382/149 |
| 2003/0142722 | A1 * | 7/2003 | Azami | C30B 13/28 374/120 |
| 2005/0048685 | A1 * | 3/2005 | Shibata | H01L 21/02513 438/46 |
| 2009/0260564 | A1 * | 10/2009 | Saito | C30B 29/06 117/35 |
| 2012/0018758 | A1 * | 1/2012 | Matioli | H01L 33/22 257/98 |
| 2012/0257041 | A1 | 10/2012 | Nakagaki et al. | |
| 2017/0012169 | A1 * | 1/2017 | Seki | H01L 33/12 |
| 2017/0338112 | A1 * | 11/2017 | Iso | H01L 21/02389 |
| 2019/0119112 | A1 * | 4/2019 | Yoshida | C23C 16/34 |
| 2020/0219243 | A1 * | 7/2020 | Ohashi | G01N 23/22 |
| 2020/0291541 | A1 * | 9/2020 | Deng | C30B 29/06 |
| 2021/0404801 | A1 * | 12/2021 | Doi | H01J 37/28 |

OTHER PUBLICATIONS

Office Action dated Jul. 8, 2021 in Korean Application No. 10-2020-7002866.

International Search Report w/Translation dated Nov. 14, 2017 submitted in PCT/JP2017/030057 filed Aug. 23, 2017.

\* cited by examiner

[FIG. 1]
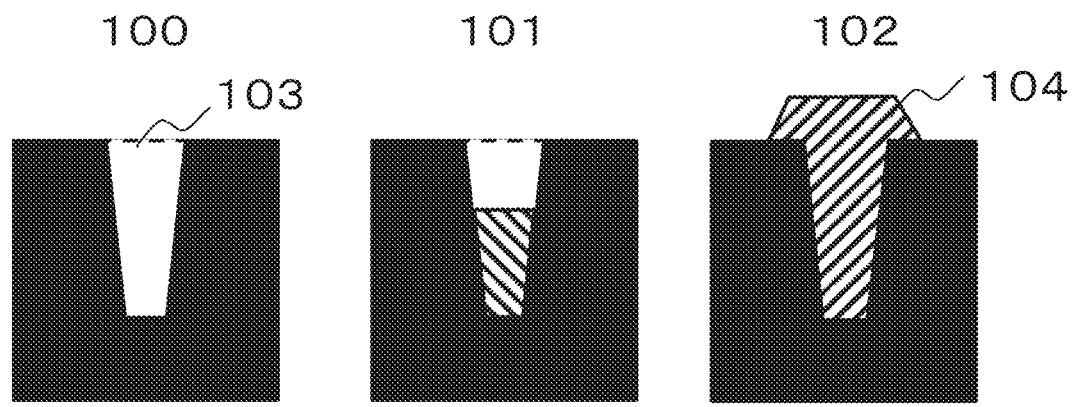
[FIG. 2]
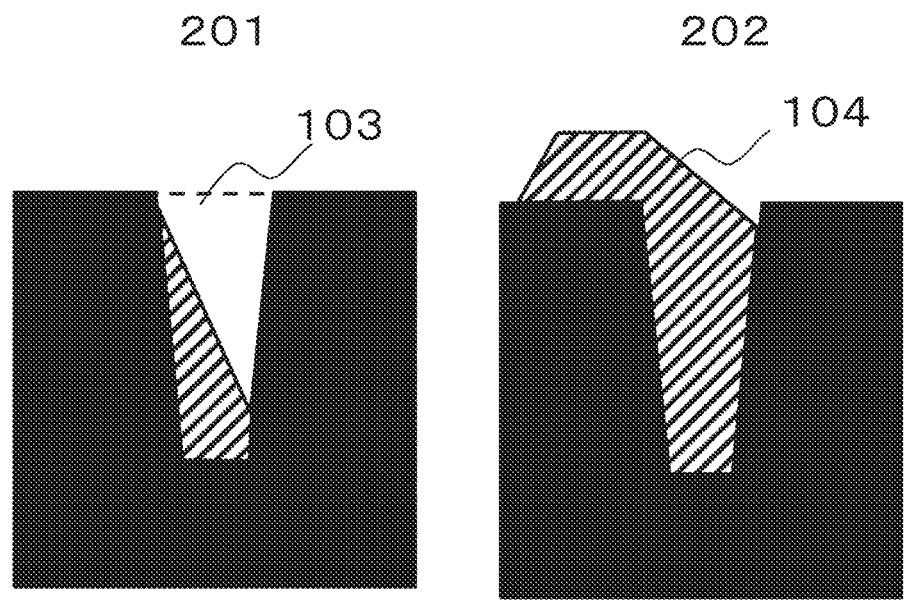

[FIG. 3]
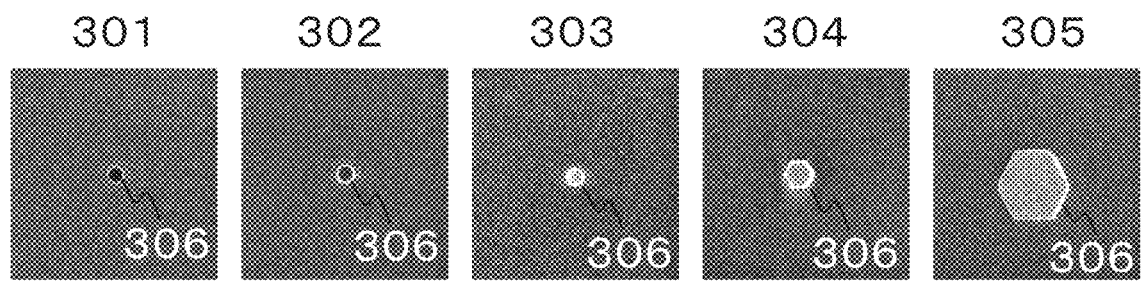
[FIG. 4]
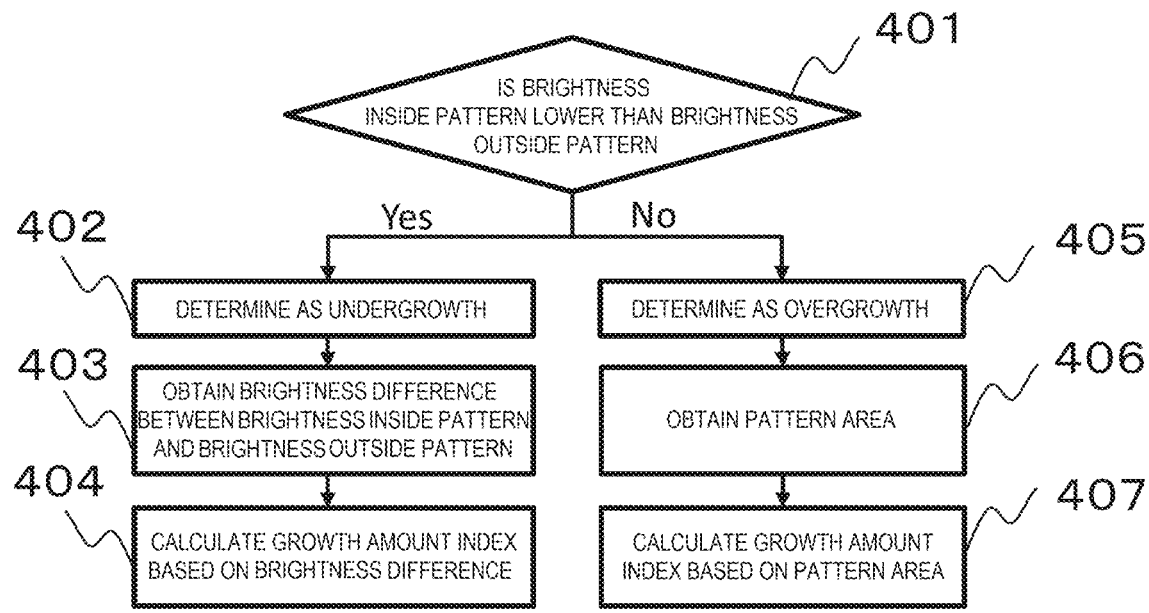

[FIG. 5]
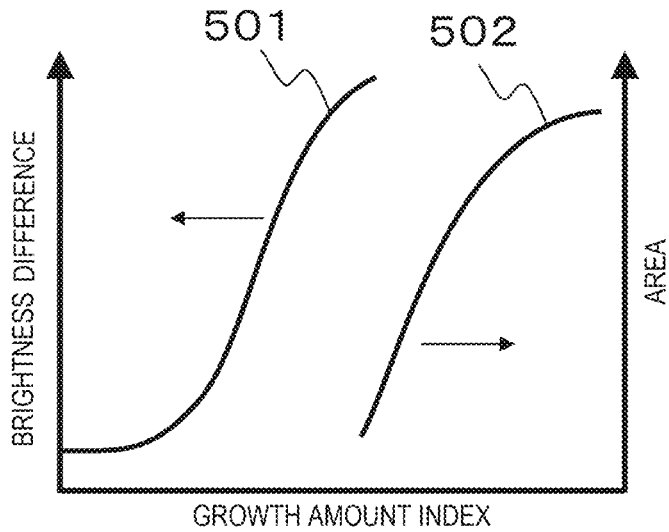
[FIG. 6]
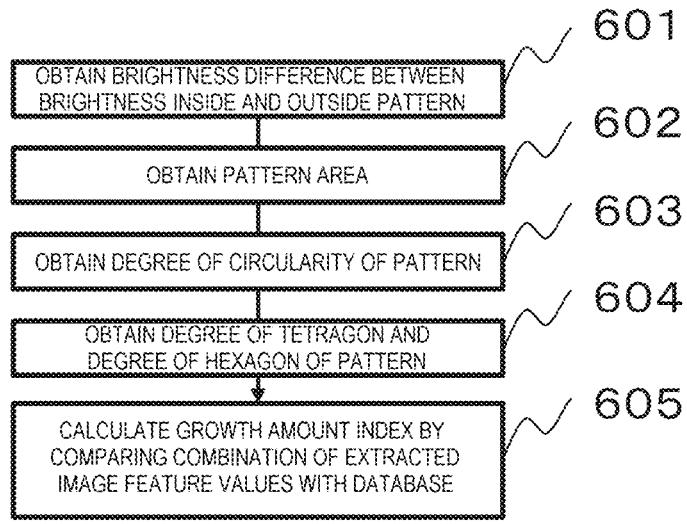

[FIG. 7]
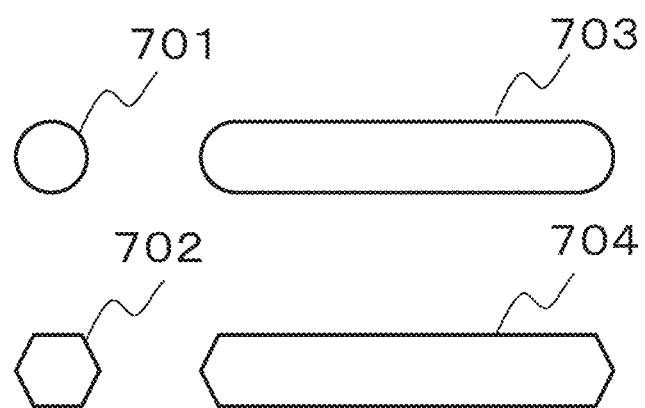
[FIG. 8]
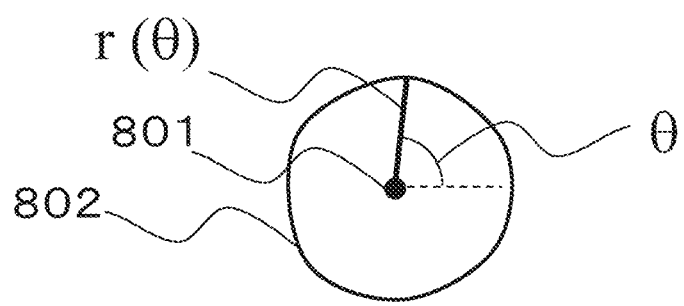

[FIG. 9]
| GROWTH AMOUNT INDEX | BRIGHTNESS DIFFERENCE (STANDARDIZED) | AREA (STANDARDIZED) | DEGREE OF CIRCULARITY | DEGREE OF HEXAGON |
|---|---|---|---|---|
| -4 | -6 | 1 | 1 | 0 |
| -3 | -5 | 1 | 1 | 0 |
| -2 | -4 | 1 | 1 | 0 |
| -1 | -3 | 1 | 1 | 0 |
| 0 | 0 | 1 | 1 | 0 |
| 1 | 2 | 2 | 0.7 | 1 |
| 2 | 3 | 4 | 0.5 | 0.5 |
| 3 | 4 | 8 | 0.5 | 0.2 |
| 4 | 4 | 12 | 0.5 | 0.2 |

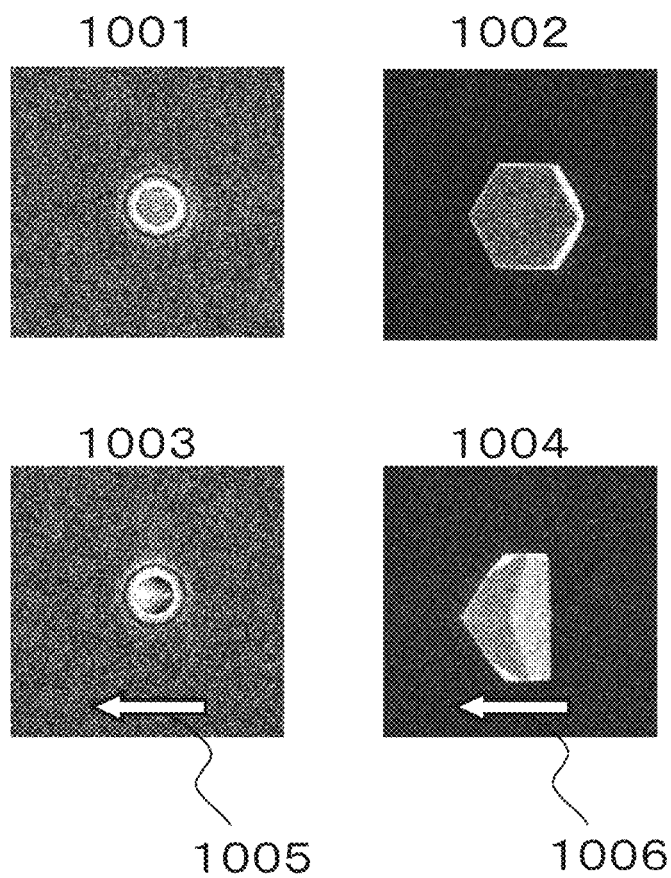
[FIG. 10]

[FIG. 11]
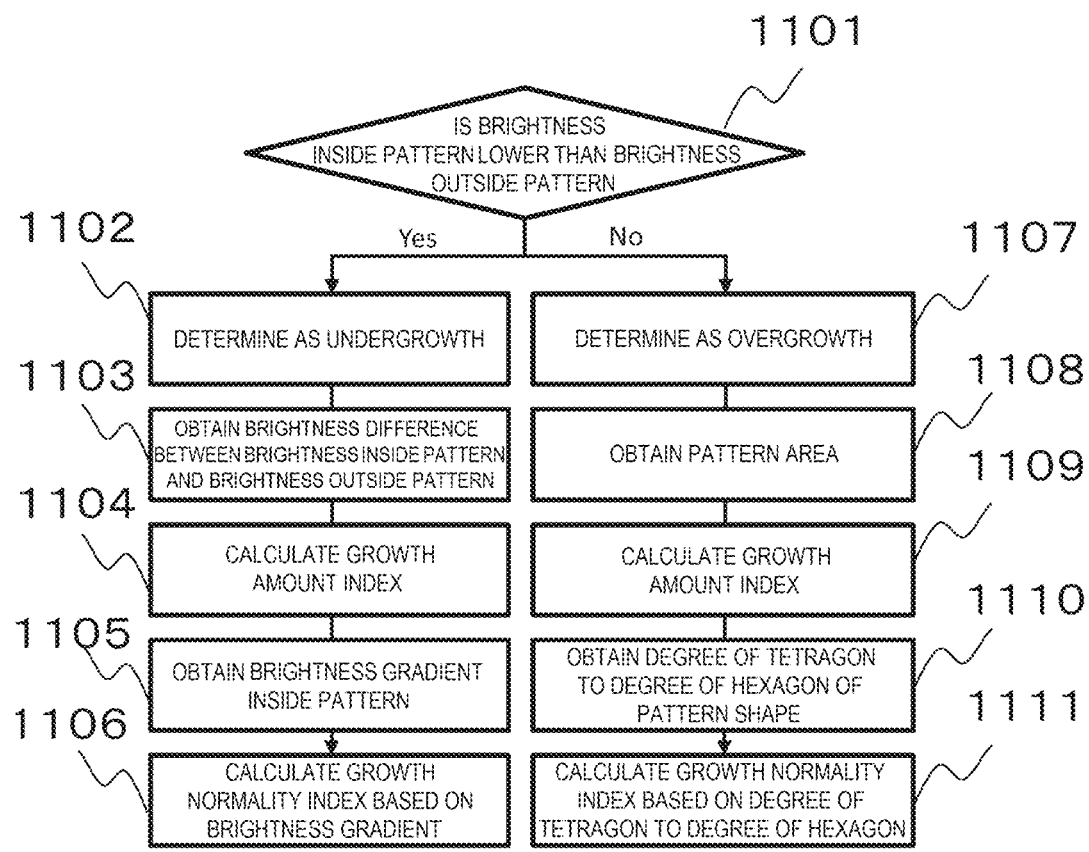
[FIG. 12]
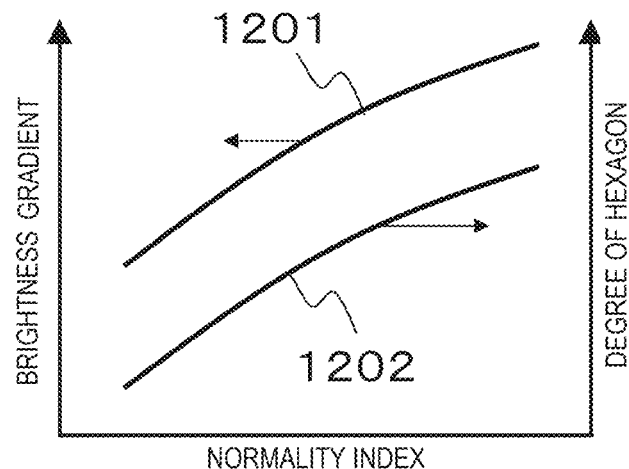

[FIG. 13]
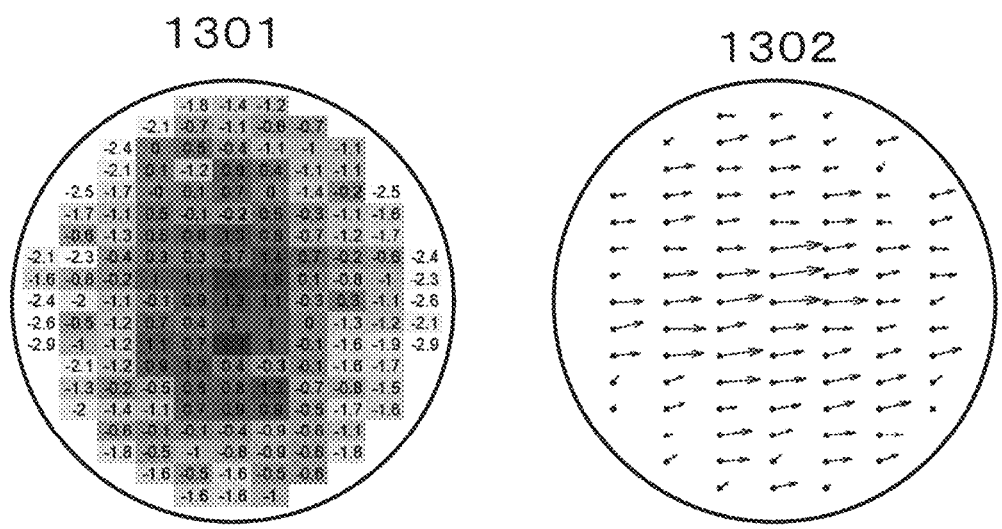
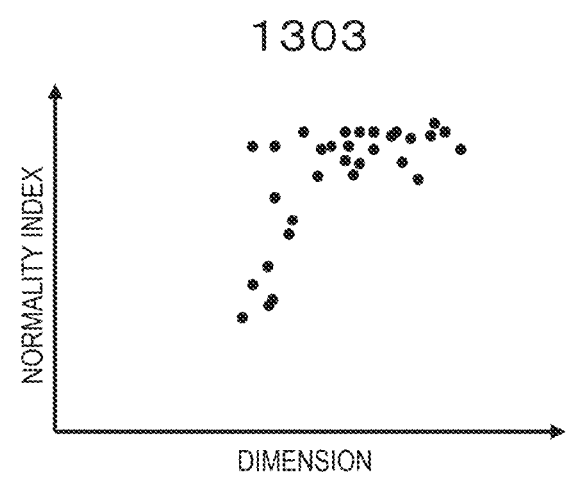

IMAGE PROCESSING DEVICE, IMAGE PROCESSING METHOD AND CHARGED PARTICLE MICROSCOPE

TECHNICAL FIELD

The present invention relates to a charged particle microscope, and more particularly, to a technique for evaluating crystal growth in a fine pattern.

BACKGROUND ART

Si is usually used in a channel of a semiconductor device, but in a future device, a high mobility group III-V compound semiconductor, SiGe, Ge, or the like is expected to be applied. In order to form a high-quality channel with these materials, a method of epitaxial growth in holes or trenches is generally used. However, the epitaxial growth is a process that is very sensitive to surface conditions and process conditions of the holes and the trenches, and a growth amount easily varies from undergrowth to overgrowth. An optimum growth amount varies depending on the process, and if the growth amount is different from the optimum growth amount, the device does not operate normally, or a problem occurs in a later process or a defect pattern occurs. As a fine pattern inspection method, for example, PTL 1 discloses a method in which feature amounts of an image acquired by a scanning electron microscope (SEM) are used to determine whether a target pattern is normal or defective.

CITATION LIST

Patent Literature

PTL 1: PTL 1: JP-A-2011-119471

SUMMARY OF INVENTION

Technical Problem

The defect inspecting method disclosed in PTL 1 inspects whether a fine pattern is a defect based on image feature values such as a pattern shape in an SEM image obtained by imaging the target pattern. However, in epitaxial growth in the holes and the trenches, pattern features in the SEM image differ between undergrowth and overgrowth, and therefore, the method in related art cannot evaluate the crystal growth amount in a wide range from undergrowth to overgrowth. In addition, quantitative evaluation cannot be performed.

On the other hand, if a cross-sectional observation technique such as a cross-sectional transmission electron microscope (TEM) is used, a state of crystal growth in the holes and trenches can be observed directly, so that quantitative evaluation of crystal growth amount and evaluation of crystal growth normality can be implemented. However, these methods are destructive inspection, and are not suitable for use in the semiconductor process.

An object of the invention is to provide an image processing device, an image processing method, and a charged particle microscope by which a crystal growth amount and crystal growth normality can be quantitatively evaluated in a wide range from an undergrowth state to an overgrowth state with nondestructive inspection.

Solution to Problem

In order to achieve the above object, the invention provides an image processing device, in which pattern brightness and a pattern area are extracted as image feature values from an image of a concave pattern obtained by a charged particle beam microscope, and a growth amount index of crystal growth in the pattern is calculated by using the pattern brightness and the pattern area which are extracted.

Further, in order to achieve the above object, the invention provides an image processing method including extracting pattern brightness and a pattern area as image feature values from an image of a concave pattern obtained by a charged particle beam microscope; and calculating a growth amount index of crystal growth in the pattern by using the pattern brightness and the pattern area which are extracted, in which the extracting and the calculating are performed by an image processing device.

Further, in order to achieve the above object, the invention provides a charged particle microscope including a detecting unit configured to detect a secondary charged particle obtained from a crystal after the crystal is irradiated with a charged particle; and an image processing unit configured to process an image of a concave pattern on a surface of the crystal which is obtained from a detection signal of the detecting unit, in which the image processing unit is configured to extract pattern brightness and a pattern area as image feature values from the image, and calculate a growth amount index of crystal growth of the pattern by using the pattern brightness and the pattern area which are extracted.

Advantageous Effect

According to the invention, the crystal growth amount or the crystal growth normality of a crystal grown by epitaxial growth can be quantitatively measured in a wide range from undergrowth to overgrowth.

BRIEF DESCRIPTION OF DRAWINGS

FIG. 1 is a schematic diagram of examples of a pattern cross-section in an undergrowth state and an overgrowth state.

FIG. 2 is a schematic diagram of examples of a pattern cross-section when crystal growth becomes abnormal.

FIG. 3 is a diagram illustrating examples of SEM images of a pattern after epitaxial growth is performed in a hole.

FIG. 4 is a flowchart illustrating an example of image processing according to a first embodiment.

FIG. 5 is a diagram illustrating an example of a calibration curve for calculating a crystal growth amount index according to the first embodiment.

FIG. 6 is a flowchart illustrating an example of image processing according to a second embodiment.

FIG. 7 is a diagram illustrating an example of a template used for evaluation on degree of hexagon according to the second embodiment.

FIG. 8 is an illustrative diagram illustrating angular dependence of a radius for the evaluation on degree of hexagon according to the second embodiment.

FIG. 9 is a diagram illustrating an example of a database for calculating a crystal growth amount index according to the second embodiment.

FIG. 10 is a diagram illustrating examples of SEM images of a pattern after epitaxial growth is performed in a hole according to a third embodiment and a fourth embodiment.

FIG. 11 is a flowchart illustrating an example of image processing according to the third embodiment and the fourth embodiment.

FIG. 12 is a diagram illustrating examples of calibration curves for calculating a normality index of crystal growth according to the third embodiment and the fourth embodiment.

FIG. 13 is a diagram illustrating an example of a method for displaying results according to a fifth embodiment.

DESCRIPTION OF EMBODIMENTS

Before describing embodiments of the invention, an object of the invention will be described with reference to the drawings in order to facilitate understanding of the invention. In the present description, a hole pattern or a trench pattern of a crystal surface formed in a hole or a trench is collectively referred to as a concave pattern. Further, in this description, pattern brightness means brightness inside a pattern, brightness outside the pattern, brightness inside and outside a pattern or a brightness difference between brightness inside and outside the pattern.

FIG. 1 is a schematic diagram illustrating examples of a pattern cross-section in an undergrowth state and an overgrowth state. Reference numeral 100 is a pattern cross-section before crystal growth. Results of growing a group III-V crystal or the like in such a hole or trench 103 is illustrated as Reference numeral 101 or 102. Reference numeral 101 is a pattern cross-section in the undergrowth state, where a crystal 104 is grown only in a part of the hole or trench. Reference numeral 102 is a pattern cross-section in the overgrowth state, where the crystal overflows from of the hole or trench.

As described above, a defect inspecting method in related art inspects whether or not a fine pattern is defective based on an image feature value such as a pattern shape in an SEM image obtained by imaging a target pattern. However, since pattern features in the SEM image are different between undergrowth and overgrowth during epitaxial growth in the hole or trench, a crystal growth amount cannot be evaluated in a wide range from the undergrowth to the overgrowth. In addition, quantitative evaluation cannot be performed.

FIG. 2 is a schematic diagram of examples of a pattern cross-section when the crystal growth becomes abnormal. Reference numeral 201 is abnormal growth in the undergrowth state, and Reference numeral 202 is abnormal growth in the overgrowth state. In the abnormal growth 202 in the overgrowth state, a shape of the pattern in a top-down SEM image is different from a normal shape, and therefore it can be determined whether it is normal or abnormal by the defect inspecting method in related art. Meanwhile, in the abnormal growth 201 in the undergrowth state, since the concave pattern in the top-down SEM image does not change to the normal growth 101, it is difficult to evaluate normality by the defect inspecting method in related art.

The invention can solve such a problem in related art by various embodiments described below.

First Embodiment

The first embodiment is described as an embodiment of image processing in which image feature values including pattern brightness and a pattern area are extracted from fine pattern SEM images obtained by a top-down SEM serving as a charged particle microscope, and a crystal growth amount index is calculated. That is, the first embodiment is an embodiment of an image processing device and an image processing method, in which the image feature values including the pattern brightness and the pattern area are extracted from images with a concave pattern obtained by the charged particle microscope, and the growth amount index of the crystal growth in the concave pattern is calculated by using the pattern brightness and the pattern area which are extracted. Further, the first embodiment is an embodiment of a charged particle microscope that includes a detecting unit configured to detect a secondary charged particle obtained from a crystal after the crystal is irradiated with a charged particle, and an image processing unit configured to process images with a concave pattern on a surface of the crystal which are obtained from a detection signal of the detecting unit, in which the image processing unit is configured to extract a pattern brightness and a pattern area as image feature values from the images, and calculate a growth amount index of crystal growth in the pattern by using the pattern brightness and the pattern area which are extracted. In the present description, the crystal growth amount index means an index representing a degree of crystal growing.

FIG. 3 is a diagram illustrating examples of SEM images with a concave pattern after epitaxial growth is performed in a hole, and a crystal growth amount increases in the order of 301, 302, 303, 304, and 305. Hereinafter, an example in which these SEM images are used will be described. Unless otherwise stated, the same method can be applied to a case of crystal growth in a trench which is another concave pattern.

FIG. 4 illustrates an example of a flowchart of image processing according to the first embodiment. In step 401, whether brightness inside a target pattern is lower than brightness outside the pattern is determined. Here, the pattern means a pattern in the SEM image as indicated by 306 in FIG. 3. In this step 401, averages of the brightness of pixels located inside and outside the pattern are used as brightness inside and outside the pattern. A boundary line of inside and outside the pattern may be extracted by using any method such as the image processing or an edge detection function installed in the SEM. A region outside the pattern may be an entire image excluding the inside of the pattern, but when there are foreign matters or patterns other than the pattern to be evaluated in the image, it is desirable to set a region not including these patterns or foreign matters as the region outside the pattern. When the brightness inside the pattern is lower than the brightness outside the pattern (Yes), the image processing proceeds to step 402, and when the brightness inside the pattern is higher than the brightness outside the pattern (No), the image processing proceeds to step 405.

In step 402, the crystal growth of the target pattern is determined as the undergrowth.

In step 403, a brightness difference between the brightness inside the pattern and the brightness outside the pattern is obtained. Here, a brightness difference between the brightness inside the pattern and the brightness outside the pattern obtained in step 401 may be used. However, since brightness of an actual SEM image is generally influenced by settings of an amplification factor of a detector, a contrast due to the image processing and adjustment of brightness offset, quantitative comparison always cannot be performed between the images. It is desirable to obtain the brightness difference between the brightness inside the pattern and the brightness outside the pattern after calculating brightness which is obtained by correcting the influence of the detector or the image processing on the brightness of the image. Alternatively, assuming that variation of a signal amount outside the pattern is essentially constant, the brightness difference of the image may be standardized with a standard deviation of the brightness outside the pattern, such that the influence of the detector or the image processing is corrected.

In step 404, the growth amount index is calculated based on the brightness difference. This step 404 is based on a principle that in the undergrowth state, when the crystal growth amount is small, among SEM signal electrons generated at a bottom of the hole, a proportion of the electrons that escape from the hole and are detected by the detector becomes small, and therefore, the brightness decreases.

In practice, a first calibration curve 501 in FIG. 5 is prepared in advance, and the growth amount index may be calculated based on this curve. When dimensions of the holes are different, detection rates of the SEM signal electrons generated at the bottom of the holes are different even when the crystal growth amount is same. It is desirable to correct an influence due to the dimension of the holes before comparing with the calibration curve 501. This correction may be a method of standardizing an opening portion of the hole at a solid angle when viewed from the bottom of the hole, or a method of standardizing the opening portion at an effective solid angle in consideration of angle dependence of signal electron intensity. Alternatively, this correction may be performed by using simulation.

In step 405, the crystal growth of the target pattern is determined as the overgrowth.

In step 406, the pattern area is obtained.

In step 407, the growth amount index is calculated based on the pattern area. This is based on a principle that in the overgrowth state where the crystal protrudes from the hole, the crystal grows not only in the vertical direction but also in the horizontal direction as the crystal growth proceeds, and the area when viewed from the top-down increases. In practice, a second calibration curve 502 in FIG. 5 is prepared in advance, and the growth amount index may be calculated based on this curve.

In a process of practically evaluating the growth amount index, a sample is produced by changing a crystal growth time, and two types of the calibration curves 501 and 502 illustrated in FIG. 5 may be prepared by measuring the brightness difference between the brightness inside the pattern and the brightness outside the pattern, and the pattern area. In this case, the crystal growth time corresponds to the growth amount index. Alternatively, an electron scattering simulation is performed on shape models whose crystal volumes are different to obtain SEM signal intensity, and a calibration curve may be prepared based on the SEM signal intensity. Since the calibration curves are considered to be approximately the same when the dimensions of the holes in which the crystal is grown are the same, a calibration curve prepared by a typical process may be commonly used. By using the two kinds of calibration curves 501 and 502 as illustrated in FIG. 5, a single growth amount index from the brightness difference and the area can be calculated.

By using this embodiment, the crystal growth amount index can be quantitatively measured in the wide range from the undergrowth to the overgrowth.

Second Embodiment

The second embodiment is described as an embodiment in which image feature values including pattern brightness, a pattern area, a degree of circularity of the pattern, and a degree of tetragon to a degree of hexagon of the pattern are extracted from the fine pattern SEM images obtained by the top-down SEM, and a crystal growth amount index is calculated. FIG. 6 illustrates an example of a flowchart of image processing according to the second embodiment. In the description of the present embodiment, the degree of hexagon will be described as an example of the degree of tetragon to the degree of hexagon of the pattern, but the following description can be similarly applied to the degree of tetragon.

In step 601, a brightness difference between brightness inside and outside the pattern is extracted as in step 403.

In step 602, a pattern area is obtained as in step 406.

In step 603, the degree of circularity of the pattern is obtained. Here, the degree of circularity may be defined by a variation in a distance from a pattern center to an edge of the pattern, or by a radius difference between a circumscribed circle and an inscribed circle of a pattern contour, or by a ratio of the area to a circumferential length of the pattern. Alternatively, any other definition may be used as long as similarity to a perfect circle of the shape can be quantitatively defined. Since the case of crystal growth in the hole is described here, the degree of circularity is used as the image feature value. However, when the trench is bring down for the crystal growth, instead of the degree of circularity, a smooth degree of the pattern shape may be used as the image feature value. For example, the smooth degree may be obtained based on a curvature of the pattern contour. Here, a radius of the curvature may be defined by the maximum value of the curvature in the pattern contour, or may be defined by an average of the curvature over the entire pattern contour, or may be defined by an average of the curvature only at both ends of the trench. Alternatively, any other definition may be used as long as smoothness of the shape contour can be quantitatively defined.

In step 604, the degree of tetragon to the degree of hexagon of the pattern is obtained. Here, a method for obtaining the degree of hexagon of the pattern is described as an example. In one method, pattern matching is performed between a hexagonal template and an SEM image or the pattern contour, and a score of the matching is used. As illustrated in FIG. 7, the hexagonal template is necessary to have a shape determined according to the concave pattern such as the hole or the trench for crystal growth. For example, as illustrated in FIG. 7, in the case of a hole pattern 701, a regular hexagon 702 needs to be used; and in the case of a trench pattern 703, a flat hexagon 704 of which each vertex has an angle of 120 degrees and an aspect ratio is the same as that of the trench pattern needs to be used. Further, another method may be used to quantify a degree of similarity of the pattern shape to a polygon, and a degree of coincidence of the angle of the vertex with 120 degrees. As a quantification method, for example, a root sum square of a difference between the angle of the vertex and 120 degrees, and the like may be calculated. As another method that can be applied in the case of crystal growth in the hole, a dependence of a distance r from a pattern center 801 to a pattern contour 802 as illustrated in FIG. 8 on azimuth angle θ is obtained, and an amplitude A of the 6th-order symmetrical component calculated by using the following equation 1 may be defined as a value standardized by the dimension of the pattern. Alternatively, any other definition may be used as long as the degree of similarity of the shape contour to a hexagon can be quantitatively defined.

$$A = \frac{1}{\pi}\int_{-\pi}^{\pi} r(\theta)e^{-j(6\theta)}d\theta$$ [Equation 1]

In step 605, the growth amount index is calculated by comparing a combination of the image feature values extracted in steps 601 to 604 with a database created in advance. Here, as illustrated in a table 901 in FIG. 9, the database describes a standard brightness difference between brightness inside and outside the pattern, an area, a degree of circularity, and a degree of hexagon with respect to the crystal growth amount index. FIG. 9 illustrates an example in which numerical values are appropriately standardized. The change of the brightness difference and the area as crystal growth are as described in the first embodiment.

In addition, information on a change of the pattern shape is also used in the present embodiment. When the crystal is in the undergrowth state, the pattern shape is limited by the shape of the hole and becomes circular; but when the crystal protrudes from the hole, it becomes a hexagonal shape reflecting crystallinity, and when the crystal growth further proceeds, the hexagonal shape is broken and becomes indefinite. A combination of the image feature values does not necessarily match the combination in the database, but a most similar combination may be selected. In a method for selecting similar combinations, the combination of image feature values is regarded as a vector representing a position in a multidimensional space, and the evaluation can be performed on a distance between the vectors. A method for calculating the distance may be any commonly used method.

By using this embodiment, the crystal growth amount index can be obtained by using information on the change in shape of the concave pattern, and more robust measurement is possible.

Third Embodiment

The third embodiment is described as an embodiment in which image feature values including brightness, a pattern area, a degree of circularity, and a degree of tetragon to a degree of hexagon of the pattern are extracted from the fine pattern SEM images obtained by the top-down SEM, and a normality index of crystal growth is calculated in addition to the crystal growth amount index. In the present description, the normality index of crystal growth means an index representing uniformity of the crystal growth.

FIG. 10 illustrates examples of SEM images of patterns after epitaxial growth is performed in a hole, in which Reference numeral 1001 is a case of normal undergrowth, Reference numeral 1002 is a case of normal overgrowth, Reference numeral 1003 is a case of undergrowth and a growth state is abnormal, Reference numeral 1004 is a case of overgrowth and a growth state is abnormal. These respectively correspond to the schematic views of the cross-sections illustrated by 101 and 102 in FIG. 1, and 201 and 202 in FIG. 2. FIG. 11 is a flowchart illustrating image processing according to the third embodiment.

Steps 1101 to 1104 are the same as steps 401 to 404 in the flowchart of FIG. 4 of the first embodiment.

In step 1105, a brightness gradient inside the pattern is obtained. During obtaining the brightness gradient, as described in the first embodiment, the gradient is obtained after calculating the brightness which is obtained by correcting the influence of the detector and the image processing. Alternatively, assuming that variation of a signal amount outside the pattern is essentially constant, the brightness difference of the image is standardized with the standard deviation of the brightness outside the pattern, such that the influence of the detector or the image processing is corrected.

In step 1106, the normality index of the crystal growth is calculated based on the brightness gradient. This is based on that, as illustrated by 1001 in FIG. 10, when the crystal growth is progressing uniformly, a scale in the pattern is uniform, and in contrast, as illustrated by 1003 in FIG. 10, when the deviation of the crystal growth occurs, the brightness gradient in the pattern increases. Specifically, a calibration curve 1201 in FIG. 12 is prepared in advance, and growth normality may be calculated based on this curve.

Steps 1107 to 1109 are the same as steps 405 to 407 in the flowchart of FIG. 4 of the first embodiment.

In step 1110, a degree of tetragon to a degree of hexagon of the pattern shape is obtained. This method is the same as step 604 in the flowchart of FIG. 6 according to the second embodiment.

In step 1111, the growth normality index is calculated based on the degree of tetragon to the degree of hexagon. This is based on that as illustrated by 1002 in FIG. 10, when the crystal growth is normal, a shape of the crystal when viewed from the top-down is a regular hexagon when the crystal is grown in the hole, and is a flat hexagon of which each vertex has an angle of 120 degrees when the crystal is grown in the trench; in contrast, as illustrated by 1004 in FIG. 10, when the crystal growth is abnormal, the shape is a pentagon or other shapes. Specifically, a calibration curve 1202 in FIG. 12 is prepared in advance, and the growth normality may be calculated based on this curve.

These two types of the calibration curves 1201 and 1202 illustrated in FIG. 12 may be prepared such that in the process of practically evaluating the growth amount index, while changing process conditions such as crystal growth selectivity, wafers are created by changing the crystal growth time, and the brightness gradient and the degree of tetragon to the degree of hexagon are measured, so as to become a similar crystal growth normality index regardless of the growth time under similar process conditions. As the process conditions to be changed, a parameter corresponding to the cleanliness of the surface, such as a cleaning time before the epitaxial growth, is desirable. As another method, as illustrated in FIG. 10, a large number of SEM images from the normal growth to the abnormal growth are collected, and a database in which cleanliness is manually evaluated is created, such that a calibration curve may be created based on this database.

By using this embodiment, it is possible to measure not only the crystal growth amount index but also the normality index of the crystal growth.

Fourth Embodiment

In addition to the method described in the third embodiment, an embodiment of measuring a direction of the crystal growth will be described as the fourth embodiment. A flowchart of the present embodiment is almost the same as the flowchart of the third embodiment illustrated in FIG. 11, but the following processing is added.

In step 1105, when the brightness gradient inside the pattern is obtained, a direction thereof is also obtained. For example, in the case of the SEM image indicated by 1003 in FIG. 10, the direction indicated by 1005 is obtained.

Similarly, in step 1110, during obtaining the degree of hexagon of the pattern, when the shape is a pentagon, the direction of the pentagon is also obtained. Here, the direction of the pentagon is the direction of a vertex having an angle closest to 120 degrees among each vertex. For example, in the case of the SEM image indicated by 1004 in FIG. 10, the direction indicated by 1006 is obtained.

These directions 1005 and 1006 correspond to directions where the deviation of the crystal growth occurs.

By using this embodiment, the crystal growth amount index and the normality index of crystal growth can be measured, and which direction the crystal tends to grow also can be evaluated.

Fifth Embodiment

The fifth embodiment describes an embodiment of a method for displaying results obtained in the first embodiment to the fourth embodiment.

Reference numeral 1301 in FIG. 13 illustrates an example of a method for displaying the result of growth amount indexes, in which the growth amount indexes obtained by the method according to the first embodiment to the fourth embodiment is mapped correspondingly with positions in the wafer with respect to a large number of patterns in the wafer. Further, reference numeral 1302 in FIG. 13 illustrates an example of a method for displaying the result of the growth amount indexes and the direction of the growth, in which the growth amount index and growth direction of the crystal obtained in the fourth embodiment are respectively displayed as the vector length and the vector direction, and are plotted according to the positions of the target patterns in the wafer. By displaying these results, tendency of the crystal growth in the wafer can be easily understood. Of course, the normality index of the crystal growth can be displayed instead of the growth amount index.

Reference numeral 1303 in FIG. 13 is an example in which a correlation between the dimension of the pattern and the normality index of the crystal growth is plotted. Here, as a dimension, a dimension measured based on the pattern contour in a case of undergrowth such as 1001 or 1003 in FIG. 10 may be used, or a dimension obtained by measuring the pattern before crystal growth in advance as illustrated by 100 in FIG. 1 may be used. By displaying the results, the abnormality of crystal growth occurs at which pattern can be easily understood. Of course, the growth amount index can be displayed instead of the normality index of the crystal growth.

The invention is not limited to the above-described embodiments, and includes various modifications. For example, the embodiments described above have been described in detail for better understanding of the invention, and are not necessarily limited to the embodiments that include all the configurations described above. In addition, a part of the configuration of one embodiment can be replaced with the configuration of another embodiment, and the configuration of another embodiment can be added to the configuration of one embodiment. In addition, a part of the configuration of the embodiment may be added, deleted, or replaced with another configuration, for example, instead of the SEM using electrons that are charged particles, other charged particle microscopes such as a focused ion beam device that detects secondary charged particles obtained by irradiating crystals with ions by a detecting unit may be provided.

Furthermore, although an example of creating a program for realizing a part or all of the configurations, functions, and image processing devices described above is described, it is needless to say that a part or all of them may be realized by hardware, for example, by designing an integrated circuit. In other words, all or apart of the functions of the processing unit may be realized by an integrated circuit such as an Application Specific Integrated Circuit (ASIC) or a Field Programmable Gate Array (FPGA) instead of the program.

REFERENCE SIGN LIST

100: Pattern cross-section before crystal growth
101: Pattern cross-section in undergrowth state
102: Pattern cross-section in overgrowth state
103: Hole
104: Crystal by epitaxial growth
201: Pattern cross-section in undergrowth state with abnormal growth
202: Pattern cross-section in overgrowth state with abnormal growth
301 to 305: Example of SEM image of pattern by crystal growth in hole
306: Pattern
501: Calibration curve illustrating relationship between brightness difference and growth amount index
502: Calibration curve illustrating relationship between area and growth amount index
701: Schematic view of hole
702: Template shape used for evaluation on degree of hexagon
701: Schematic view of trench
704: Template shape used for evaluation on degree of hexagon
801: Pattern center
802: Pattern contour
901: Table
1001: Example of SEM image of pattern in undergrowth state with normal growth
1002: Example of SEM image of pattern in overgrowth state with normal growth
1003: Example of SEM image of pattern in undergrowth state with abnormal growth
1004: Example of SEM image of pattern in overgrowth state with abnormal growth
1005: Direction of crystal growth
1201: Calibration curve illustrating relationship between brightness gradient and growth normality
1202: Calibration curve illustrating relationship between degree of hexagon and growth normality
1301: Example of method for displaying results of growth amount indexes
1302: Example of method for displaying results of growth amount indexes and growth directions
1303: Correlation plot between pattern dimension and normality index of crystal growth

The invention claimed is:

1. A charged particle microscope comprising:
   a detecting unit configured to detect a secondary charged particle obtained from a crystal after the crystal is irradiated with a charged particle; and
   an image processing unit configured to process an image of a concave pattern on a surface of the crystal which is obtained from a detection signal of the detecting unit, wherein
   the image processing unit is configured to extract pattern brightness and a pattern area as image feature values from the image, and calculate a growth amount index of crystal growth of the pattern by using the pattern brightness and the pattern area which are extracted, wherein
   the image processing unit is configured to
   in a case where brightness inside the pattern is lower than brightness outside the pattern, measure a brightness difference between the brightness inside the pattern and the brightness outside the pattern, and calculate the growth amount index based on the brightness difference and a first calibration curve prepared in advance, and
   in a case where the brightness inside the pattern is higher than the brightness outside the pattern, calculate the growth amount index based on the pattern area and a second calibration curve prepared in advance.

2. A charged particle microscope comprising:
a detecting unit configured to detect a secondary charged particle obtained from a crystal after the crystal is irradiated with a charged particle; and
an image processing unit configured to process an image of a concave pattern on a surface of the crystal which is obtained from a detection signal of the detecting unit, wherein
the image processing unit is configured to extract pattern brightness and a pattern area as image feature values from the image, and calculate a growth amount index of crystal growth of the pattern by using the pattern brightness and the pattern area which are extracted, wherein
the image processing unit is configured to further extract a pattern shape from the image as the image feature value, and
the pattern shape refers to a degree of circularity of the pattern, and a degree of tetragon to a degree of hexagon of the pattern.

3. The charged particle microscope according to claim 2, wherein
the pattern brightness refers to a brightness difference between brightness inside the pattern and brightness outside the pattern, and
the image processing unit is configured to calculate the growth amount index by comparing the brightness difference, the pattern area, the degree of circularity of the pattern, and the degree of tetragon to the degree of hexagon of the pattern with a calibration table prepared in advance.

4. A charged particle microscope comprising:
a detecting unit configured to detect a secondary charged particle obtained from a crystal after the crystal is irradiated with a charged particle; and
an image processing unit configured to process an image of a concave pattern on a surface of the crystal which is obtained from a detection signal of the detecting unit, wherein
the image processing unit is configured to extract pattern brightness and a pattern area as image feature values from the image, and calculate a growth amount index of crystal growth of the pattern by using the pattern brightness and the pattern area which are extracted, wherein
the image processing unit is configured to further extract a pattern shape from the image as the image feature value,
the image processing unit is configured to calculate a normality index of the crystal growth in the pattern by using a plurality of the image feature values extracted from the image,
the image processing unit is configured to change, depending on whether brightness inside the pattern is lower or higher than brightness outside the pattern, the image feature values for calculating the growth amount index and the normality index,
the pattern shape refers to a degree of tetragon to a degree of hexagon of the pattern, and
the image processing unit is configured to
in a case where the brightness inside the pattern is lower than the brightness outside the pattern, measure a brightness difference between the brightness inside the pattern and the brightness outside the pattern, and a brightness gradient inside the pattern, and calculate the growth amount index based on the brightness difference and calculate the normality index based on the brightness gradient, and
in a case where the brightness inside the pattern is higher than the brightness outside the pattern, calculate the growth amount index based on the pattern area, and calculate the normality index based on the degree of tetragon to the degree of hexagon of the pattern.

* * * * *